(12) United States Patent
Allen et al.

(10) Patent No.: US 6,904,575 B2
(45) Date of Patent: Jun. 7, 2005

(54) METHOD FOR IMPROVING CHIP YIELDS IN THE PRESENCE OF VIA FLARING

(75) Inventors: Robert J. Allen, Jericho, VT (US); Gustavo E. Tellez, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 395 days.

(21) Appl. No.: 10/064,098

(22) Filed: Jun. 11, 2002

(65) Prior Publication Data

US 2003/0229866 A1 Dec. 11, 2003

(51) Int. Cl.$^7$ .............................................. G06F 17/50
(52) U.S. Cl. ..................... 716/4; 716/2; 716/4; 716/13; 716/14
(58) Field of Search ............................ 716/1–5, 9, 14, 716/19; 438/14

(56) References Cited

U.S. PATENT DOCUMENTS

| | | | | |
|---|---|---|---|---|
| 5,347,465 A | * | 9/1994 | Ferreri et al. | 716/19 |
| 5,798,937 A | * | 8/1998 | Bracha et al. | 716/9 |
| 6,247,853 B1 | * | 6/2001 | Papadopoulou et al. | 716/4 |
| 6,415,421 B2 | * | 7/2002 | Anderson et al. | 716/4 |
| 6,756,242 B1 | * | 6/2004 | Regan | 438/14 |
| 2002/0100005 A1 | * | 7/2002 | Anderson et al. | 716/5 |
| 2003/0084418 A1 | * | 5/2003 | Regan | 716/14 |

* cited by examiner

Primary Examiner—A. M. Thompson
Assistant Examiner—Helen Rossoshek
(74) Attorney, Agent, or Firm—McGinn & Gibb, PLLC; Richard M. Kotulak, Esq.

(57) ABSTRACT

The current invention provides a modification procedure that reduces errors in integrated circuits due to via shorts while at the same time avoiding the unnesting of the layout design and thereby permitting verification of the layout design by LVS testing tools. The current invention identifies if potentially shorting vias have electrically redundant paths and, if so, creates cloned cells of the original cell but void of the potentially shorting vias. The cloned cell is electrically comparable to the original cell. In addition, each instantiation of the original cell in the shapes data base is replaced with the cloned cell when electrical redundancy is present. Also, the number of vias removed can be minimized or maximized while, at the same time, all via electrical shorts are removed, depending on the design requirements.

27 Claims, 8 Drawing Sheets

METHOD FOR IMPROVING CHIP YIELDS IN THE PRESENCE OF VIA FLARING

BACKGROUND OF THE INVENTION

1. Field of the Invention

The present invention relates to a method for reducing via shorts on integrated circuits, and, more particularly, reducing via shorts while permitting verification of the final design by standard verification tools.

2. Description of the Related Art

Conventional integrated circuit manufacturing technologies suffer from reduced yields due to via shorts, i.e., electrical shorts. A via is a small hole used to connect electrical conducting nets from one layer of an integrated circuit to another layer. Some via shorts are caused by a phenomenon called via flaring. Via flaring occurs in areas where large number of vias are clustered together.

An integrated circuit with a via short is unusable. Integrated circuits containing a via short must be discarded. In some cases, when the number of discarded integrated circuits is large, the integrated circuit is redesigned to remove the vias causing the short. A redesign of an integrated circuit is time consuming and costly.

A conventional solution to a via short is to delete (or remove) shorting vias by applying a shape algorithm to the corresponding integrated circuit shapes database. However, for example, in a hierarchical shapes database where one cell contains all the via shapes of the database, a conventional shape algorithm may result in the deletion of all via shapes in the design.

Another conventional solution to a via short is to flatten the hierarchical design, that the flat design has a single cell with all the design shapes. A shape algorithm may then delete only those vias that might short. However, the flat design layout is impossible to compare to the design schematic, i.e., using standard layout versus schematic (hereinafter LVS ) verification methods, since the design schematic hierarchy is different from the design layout hierarchy.

SUMMARY OF THE INVENTION

In order to attain the objects suggested above, there is provided, according to one aspect of the invention, a modification procedure that reduces errors on an integrated circuit due to via shorts while at the same time avoiding the un-nesting of the layout design and thereby permitting verification of the layout design by standard LVS verification tools.

The present invention identifies potentially shorting vias, the cells in the shapes database containing these vias, and corresponding electrically redundant paths. The current invention then creates cloned cells of the original cell, but without the potentially shorting vias and, in addition, the cloned cell is electrically equivalent to the original cell.

In addition, the present invention substitutes each instantiation of the original cell in the shapes database with the cloned cell when electrical equivalency is present, hereby removing such potentially shorting vias. This substitution combined with the cell cloning enables the use of standard LVS methods for verification.

In another embodiment of the present invention, the number of vias removed are minimized while, at the same time, all via electrical shorts are removed.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF THE PREFERRED EMBODIMENTS OF THE INVENTION

The design and manufacture of integrated circuits utilize shape databases. A shape database is made up of various database elements (or database objects), such as, but not limited to, manufacturing layers or levels (such as, but not limited to, polysilicon, metal1, via1, etc.) and geometric shapes (such as, but not limited to, rectangles, polygons, etc.). Each shape can be assigned to a specific layer, named cells (which contain shapes in a local coordinate system), and/or cell transforms (or cell instances). Cell transforms contain transformations of cells (such as, but not limited to, x-y translation, mirroring, rotation angle, etc.) and are contained within other cells. A cell which contains no transforms is called a leaf cell. A cell which is not used in any cell instance is a root cell, typically an integrated circuit is described by a shape database with a single root cell.

The designer or design tool that creates the integrated circuit builds the layout design from a schematic using the different shapes or cells in the shape database. A shape database may contain hundreds of millions of shapes, with millions of cell instances in thousands of cells. A particular design usually uses the same cell multiple times throughout the design. However, each instantiation of a particular cell may be used differently in the design. For example, a cell containing three vias may be used one instance by itself to form a connection, while elsewhere in the design it may be repeated three times and covered with appropriate metal to make a single connection consisting of nine vias.

Figure 1A:
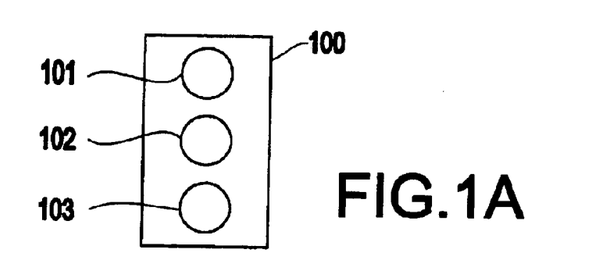
FIG. 1A is an illustration of a shapes database cell comprising potential vias.

For example, FIG. 1A is an illustration of cell 100. Cell 100 includes three vias 101, 102, 103. Cell 100 may be used in multiple instantiations.

Figure 1B:
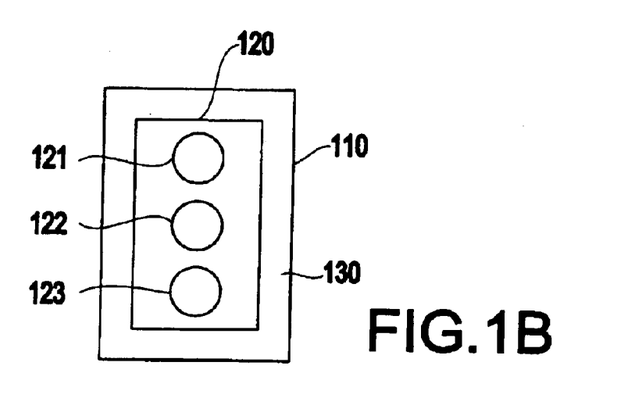
FIG. 1B is an illustration of a shapes database cell comprising actual vias.

FIG. 1B is an illustration of a single instantiation of cell 100, instantiation 110. Instantiation 110 includes one instance of cell 100, instance 120. The three vias of instance 120, i.e., vias, 121, 122, and 123, are connected by a common metal 130.

Figure 1C:
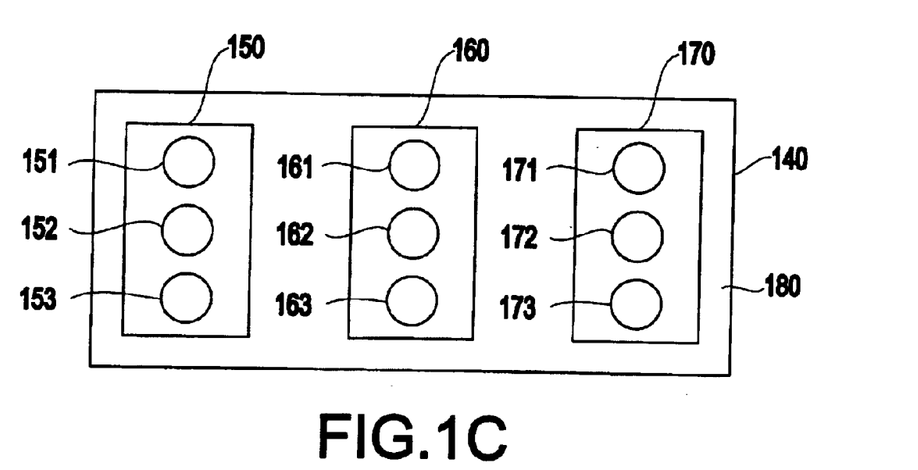

In another example, FIG. 1C is an illustration of a multiple instantiation of cell 100, instantiation 140. Instantiation 140 includes three instances of cell 100, instance 150, instance 160 and instance 170. The nine vias from instances 150, 160, 170, mainly, 151, 152, 153, 161, 162, 163, 171, 172 and 173, are connected by a common metal 180.

Note, that if via 101 is removed from cell 100 in FIG. 1A, the removed via will be removed from each instance of cell 100. Thus, in this example, a via will be removed from instance 150, 160, and 170 in FIG. 1C.

Figure 2:
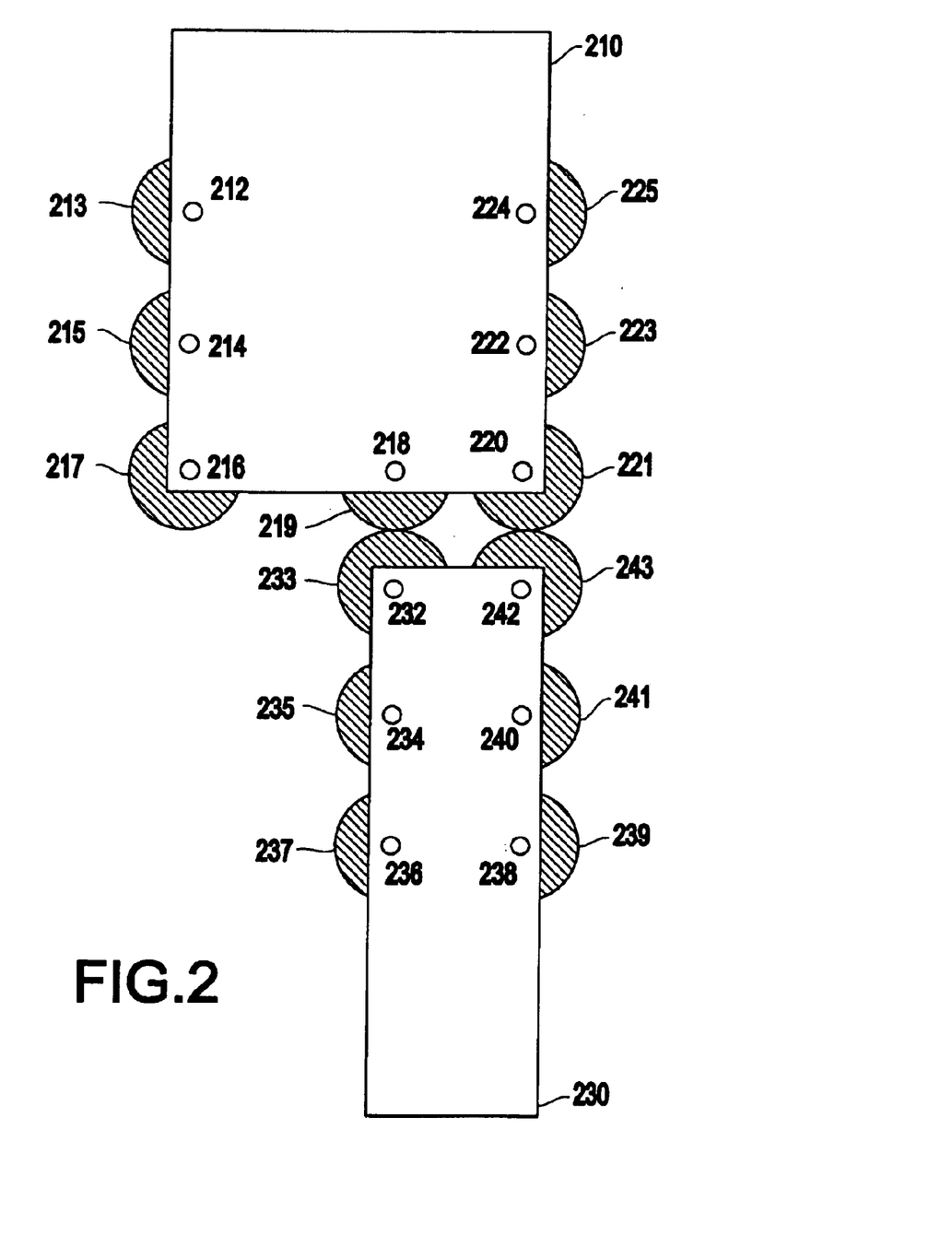
FIG. 2 is a schematic diagram of a partial layout comprising vias.

Vias will often times flare, however, which may cause a particular via to short. An integrated circuit that contains a via short is unusable and must be discarded or re-manufactured. FIG. 2 is a schematic illustration of a via short as viewed by a typical scanning electron microscope (hereinafter SEM ). The integrated circuit design illustrated in FIG. 2 shows the physical configuration of a first cell 210 and a second cell 230. First cell 210 comprises vias 212, 214, 216, 218, 220, 222 and 224 and each of these vias include an associated flaring pattern, 213, 215, 217, 219, 221, 223 and 225, respectively. Similarly, second cell 230 comprises vias 232, 234, 236, 238, 240 and 242 and each of these vias include an associated flare pattern, 233, 235, 237, 239, 241 and 243, respectively.

When a flare pattern of one via is near or overlapping with a second flare pattern, a short will occur (or, in the alternative, there is a high probability that a short will occur). Thus, in FIG. 2, since flare pattern 219 approaches and/or touches flare pattern 233 the corresponding vias 218 and 232 are at risk of shorting. Similarly, since flare pattern 221 approaches and/or touches flare pattern 243, the corresponding vias 220 and 242 are also at risk of shorting.

In addition, when a large number of vias are clustered together, the associated flaring is more pronounced and the probability of via shorts is increased. The pronounced flaring correlates to the local photolithographic light exposure resulting from the close proximity between the vias. The larger the amount of light used in the photolithographic exposure process, the larger the flaring of the via becomes. A large number of vias in close proximity exhibit large amounts of flaring.

Modern integrated circuit designs comprise upwards of one million vias. As these modern designs become more complex and the tolerances between electrical nets become smaller, the risk of via shorts due to via flaring increases. Integrated circuits containing a via short must be discarded. In some cases, when the number of discarded integrated circuits is large, the integrate circuit is redesigned to remove the vias causing the short. A redesign of an integrated circuit is time consuming and costly.

The present invention analyzes the shapes database and identifies which vias are at risk of shorting to identify via candidates for removal. Using vector analysis during the layout design process, the present invention identifies vias that touch and/or approach other vias and/or other conductive metals which may cause the via to short. The present invention then determines if any of those candidate vias can be safely removed. A candidate via may be safely removed from the layout design if it has an electrically redundant path for that particular instantiation. In order to ensure that the design remains available for LVS checking, each instantiation of the cell, where the via would otherwise reside, must be checked for electrical redundancy. If both of conditions are satisfied, the via can be safely removed from the cell, thereby creating an electrically equivalent cloned cell.

Figure 3:
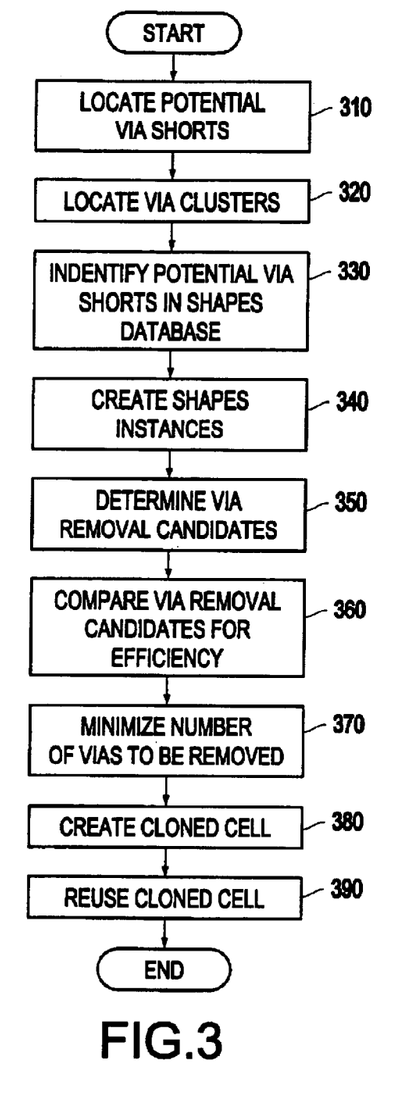
FIG. 3 illustrates a flow diagram for reducing via shorts from an integrated circuit.

More specifically, FIG. 3 illustrates a flow diagram of the preferred embodiment of the present invention for reducing via shorts from an integrated circuit.

First, potential via shorts are located 310. In a preferred embodiment of the present invention, potential via shorts are located by analyzing the shapes database. In a preferred embodiment of the present invention, an algorithm analyzes the shapes database and produces a set of error vectors describing the location of a via which might short due to flaring. This algorithm is referred to as a design rule checker (hereinafter DRC) algorithm.

For example, the DRC algorithm, by geometrically analyzing the shapes database, will identify pairs of vias in different electrical nets, which are close enough to potentially short. Of the via shapes found to be too close, and which are in different electrical nets, only those via shapes which have more than a particular number of vias within a particular distance are considered to contain potential via shorts.

At a similar time, via clusters are located 320. The identification of via clusters 320 and the identification of potential via shorts 310 may occur in either order or concurrently as these procedures are not dependent on each other. In a preferred embodiment of the present invention, a via clustering analysis identifies all vias located under the same conductors that are electrically redundant. These vias are then grouped together and are referred to as a via cluster.

More specifically, a set of vias belong to the same cluster if they are covered by the same metal above and the same metal below, thereby ensuring electrical connectivity if vias are removed from the cluster.

After potential shorts between instances of vias and clusters of instances of vias are identified, these are correlated with the shapes database to determine the cell and shapes that are affected 330. Specifically the error vectors associated with potential shorts produced by step 310 are used to find via instance paths in the shapes database, corresponding to each end of the error vector. Similarly, the via instance paths (or shape/cell pairs) involved in a via cluster are determined 340. Each cell instance may contain multiple potentially shorting vias, and each such via may be involved in multiple potential shorts.

From the list of unique via shape instances, the invention creates a list of potential via shorts that can be removed 350. Each error vector includes at least two possible vias which are candidates for removal. Each instantiation of the cell that contains a via that is a candidate for removal, must have electrical redundancy in order for the via to be safely removed. Each instantiation of the cell is checked for electrical redundancy so that the LVS hierarchy constraints are not violated. LVS verification methods seek an exact match between the electrical functionality of the layout and the electrical functionality of the design embodied in a schematic. The un-nesting of layout data can make the comparison to the design much more difficult, time-consuming, and costly than it is already. The removal of a via which does not violate the LVS hierarchy constraints is considered a safe removal. Thus, a redundant via is used in place f he faulty via when the faulty via is removed from the design.

If a via is identified as a potential via short but cannot be safely removed from the design layout, the potential via short can be addressed by traditional solutions such as flattening or selective exploding techniques.

A via candidate for removal is next analyzed against others vias for efficiency 360. In other words, the removal of one particular via as opposed to another via may be more efficient, as compared against some predetermined design criteria, such as spacing, cost, etc. For example, a particular goal may be to remove a minimum number of vias.

Another goal is to first remove candidate faulty vias from cells containing the greatest number of good vias (i.e., vias that would not otherwise short), whereby the removal of candidate faulty vias would leave more good vias.

For example, it is possible that there may be two vias on a particular cell that can otherwise be safely removed, (i.e., when analyzed individually), but cannot both be safely removed together. For instance, if the via cluster only has two vias and it is determined that both vias are available to be safely removed. The removal of both vias will violate the electrical redundancy rule. Thus, it is possible that safe removal of two vias is unsafe when considered together. In the resulting comparison, it may be determined that some of the vias will not be chosen for removal. In an alternative embodiment of the present invention, this comparison procedure can ensure that too many vias will not be removed from any one via cluster.

For example, a particular technology may allow only a maximum current density per via. Removing redundant vias in an electrical net increases the current that remaining vias must carry, and thus their current density. Current density thus constrains the maximum number of redundant vias that may be removed without negatively affecting the reliability of the circuit.

In order to minimize the change to the layout design, as few as possible cells are chosen for via removal 370. More specifically, to reduce the number of cells that will be effected, when a choice is available to make, for example, two changes on a particular cell, as opposed to a single change on each of the two cells, the former is chosen over the later. Thus, in our example, only one cell is changed as opposed to two cells. In another alternative embodiment of the present invention, unused and/or duplicate candidate vias can also be chosen for removal.

Once it is determined that a via can be removed, the via is removed from the particular cell in the layout design and an electrically equivalent clone (or copy) cell is created 380. Specifically, a new cell design is created, and then the via is removed from the new cell. This new cell is referred to as a clone, since it is electrically equivalent to the original cell, and it replaces the prior cell in the cell instances where the via can be safely removed 390, i.e., the clone is reused in each instantiation of the prior cell.

By cloning and reusing the cell, few additional cells are created in the shapes database, minimizing the increase in the size of the database and the changes in the database due to the via removal fixes. In addition, since the cloned cells are electrically equivalent, LVS verification methods can be used to compare the layout design, comprising cloned cells, with the schematic.

Figure 4:
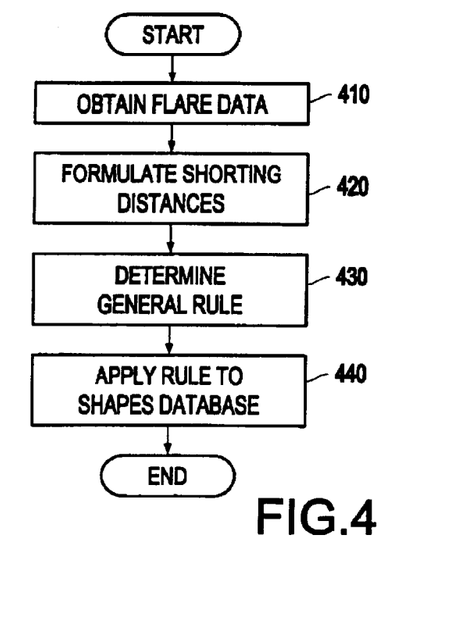
FIG. 4 illustrates a flow diagram of a design rule checker algorithm which is used to identify potential via shorts.

FIG. 4 is a flow diagram of a DRC algorithm which is used to determine which vias are at risk of shorting due to via flaring. First, flaring effect data is obtained from a fabricator 410, such as a SEM picture typical of the design. The picture will show the physical and/or geographical parameters of the design.

Once the fabrication parameters are obtained, a manufacturing window is determined 420. This manufacturing window takes into consideration the amount of space that a via should be spaced from another via in order for via shorts to not occur due to via flaring. The demand to minimize these tolerance windows is increasing as integrated circuit designs grow in complexity. By selectively removing via shorts from the layout design, the tolerances can be further minimized to maximize the available space on the integrated circuit.

Once the manufacturing window is determined, a ground rule is created that it is based on the flaring associated with a typical via 430. By considering the manufacturing window requirements and the distance requirements associated with via flaring, a ground rule is made which delineates which vias are potentially at risk of shorting. The via would potentially be at risk of shorting because the geographical shape of the flare would be too close or actually overlap with another electronic net.

Thus, without having specific knowledge of whether a particular via will short, a design rule, for example, but not limited to, a geometrical formula, is made that identifies which vias are situated in the design whereby the vias corresponding flare pattern may interact with another electronic net.

An example of a design rule would be that the minimum distance between any two vias in the same electric net is one unit, that the minimum distance between two vias in different electric net is two units, but only when the number of vias within a radius of two units is greater than, for example, four. This design rule would avoid shorts due to flaring since flaring occurs within tightly packed via clusters.

This design rule is based on a number of variables such as, but not limited to, manufacturing window, end application error tolerance, costs, etc. For example, if failure rate is not an important consideration, the manufacturing window may be larger and, thus, would be reflected in the design rule. In addition, the design rule may be different for every technology, such as, but not limited to: 1.3 micron v. 1.5 micron technology, copper vs. aluminum technology and double damascene v. no damascene technology.

In an alternative embodiment of the present invention, a design rule may be created by numerous methods, including, but not limited to manufacturing tolerances, prior designer experiences, trial and error testing.

Once a design rule is made, the rule is applied to the shapes database 440. In a preferred embodiment, each via is represented in the shapes database by an x-y coordinate. The design rule is then applied to the x-y coordinate. If a via is flagged by the design rule as having insufficient spacing, then the x-y coordinates are flagged as a via error vector.

Figure 5:
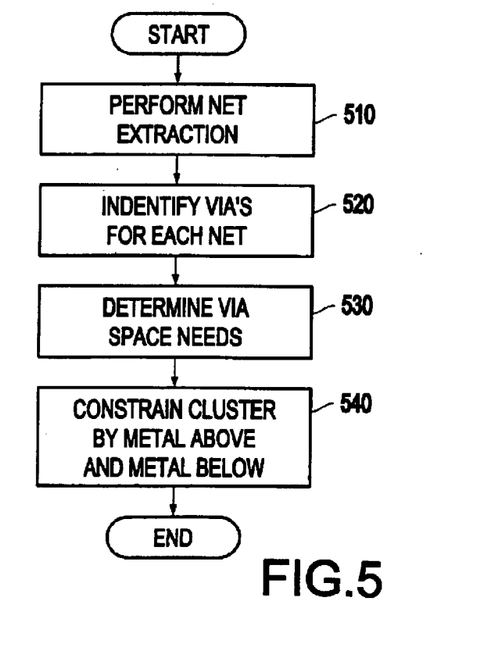
FIG. 5 illustrates a flow diagram of a via cluster analysis which is used to identify via clusters.

FIG. 5 is a flow diagram of a via cluster analysis which is used to identify via clusters. Via clusters are all the vias comprising a particular electric connection, i.e., the metal above and below the vias covers all the vias in the cluster. Ultimately, only vias from a via cluster can be removed, thereby ensuring that opens are not caused by any one removal of a via.

First, an electrical net extraction is performed on the design for all the vias in the design 510. The net extraction geometrically identifies all metal a via shapes that are connected electrically. Only those vias in the same electrical net (i.e., have the same conductive metal above and below) can remain in the cluster. Next, for each electric net identified, all the vias on that electric net are identified 520. This is referred to as a preliminary via cluster.

Once the preliminary via cluster is identified, each via is examined geographically in reference to the other vias in the preliminary via cluster 530. Those vias that are within a pre-described area (distance, space and/or pattern), and that are in the same cell remain in the via. The space is the amount of space that a via should be spaced from another via in order for via shorts to not occur due to via flaring. Utilizing the same example that accompanies FIG. 4, above, that distance would be one unit. The spacing can be determined by the design team, manufacturing tolerances, design complexity, etc.

Next, the preliminary cluster is further defined by the metal above and the metal below the preliminary via cluster 540. In a preferred embodiment of the present invention, the metal constraining process comprises enclosing the preliminary cluster in a polygon shape. The polygon shape is then overlapped with the metal above and the metal below. Only those vias that enclosed by the polygon and have metal above and below are included in the cluster.

All the via shapes in the same cluster are then stored in one unique via cell. This unique via cell is electrically redundant.

FIGS. 6A–7B are a partial schematic example of the flow diagram of FIG. 3.

Figure 6A:
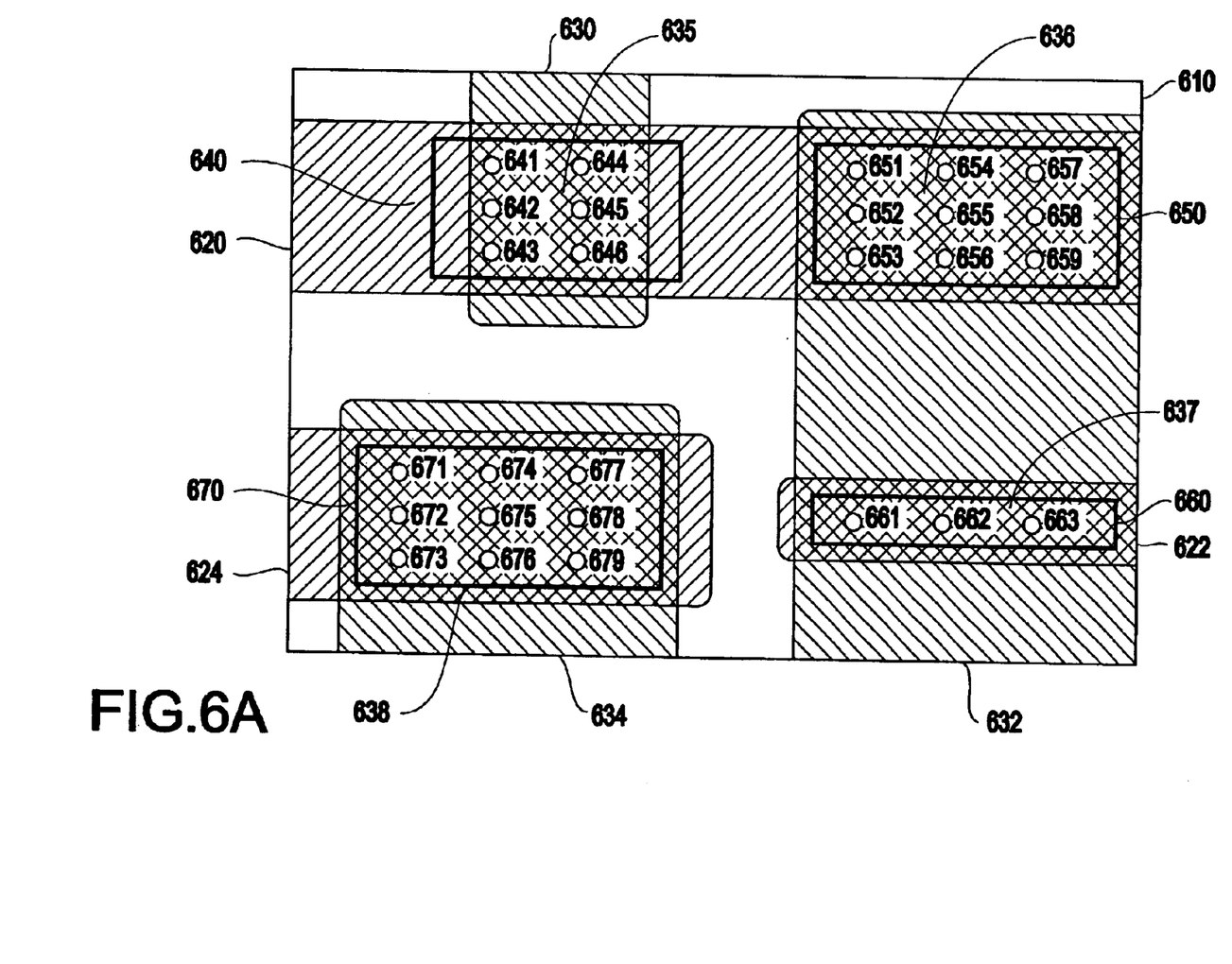
FIG. 6A illustrates a partial design layout comprising upper and lower metal electrical net patterns, cells and vias.

FIG. 6A illustrates a partial design layout 600 comprising upper and lower metal patterns, cells and vias. Design layout 610 comprises a first lower metal pattern 620, a second lower metal pattern 622, and a third lower metal pattern 624. Also shown is a first upper metal pattern 630, a second upper metal pattern 632 and a third upper metal pattern 634. This creates a first overlap (though on different layers) region 635, second overlap region 636, third overlap region 637 and fourth overlap region 638. In addition, Design Layout 610 comprises first instance 640, a second instance 650, a third instance 660 and a fourth instance 670. The first instance 640 comprises vias 641–646. The second instance 650 comprises vias 651–659. The third instance 660 comprises vias 661–663. The fourth instance 670 comprises vias 671–679.

Figure 6B:
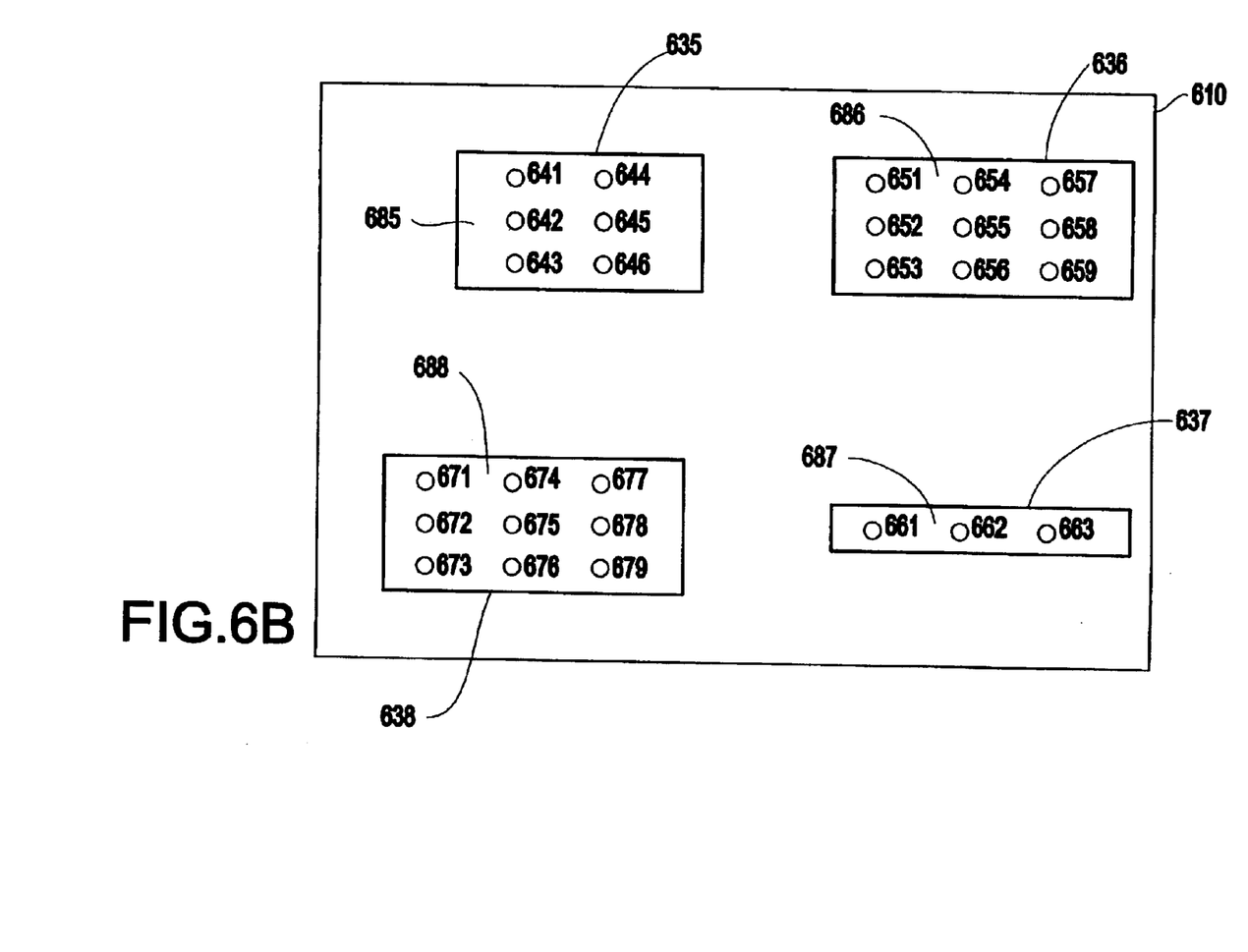
FIG. 6B illustrates a partial design layout comprising via clusters.

FIG. 6B illustrates a partial design layout 600 comprising via clusters. It was previously determined that design layout 600 comprises first electrical overlap region 635, second electrical overlap region 636, third electrical overlap region 637, and fourth electrical overlap region 638. The vias which are located or intersect with the overlap regions make up a via cluster. Thus, via cluster 685 comprises vias 641–646 since they are located within first overlap region 635, via cluster 686 comprises vias 651–659 since they are located within second overlap region 636, via cluster 687 comprises vias 661–663 since they are located within third overlap region 637, and via cluster 688 comprises vias 671–679 since they are located within fourth overlap region 638. In an alternative embodiment of the present invention, via clusters may be further identified using additional via cluster rules such as geometric shapes and/or spacing, etc.

FIGS. 6A and 6B illustrate the geometrical and electrical relationship between vias and between instances, prior to the removal of any vias. The geometrical and electrical relationships are quantified so that each via can be analyzed to determine if the via represents a potential short.

Figure 7A:
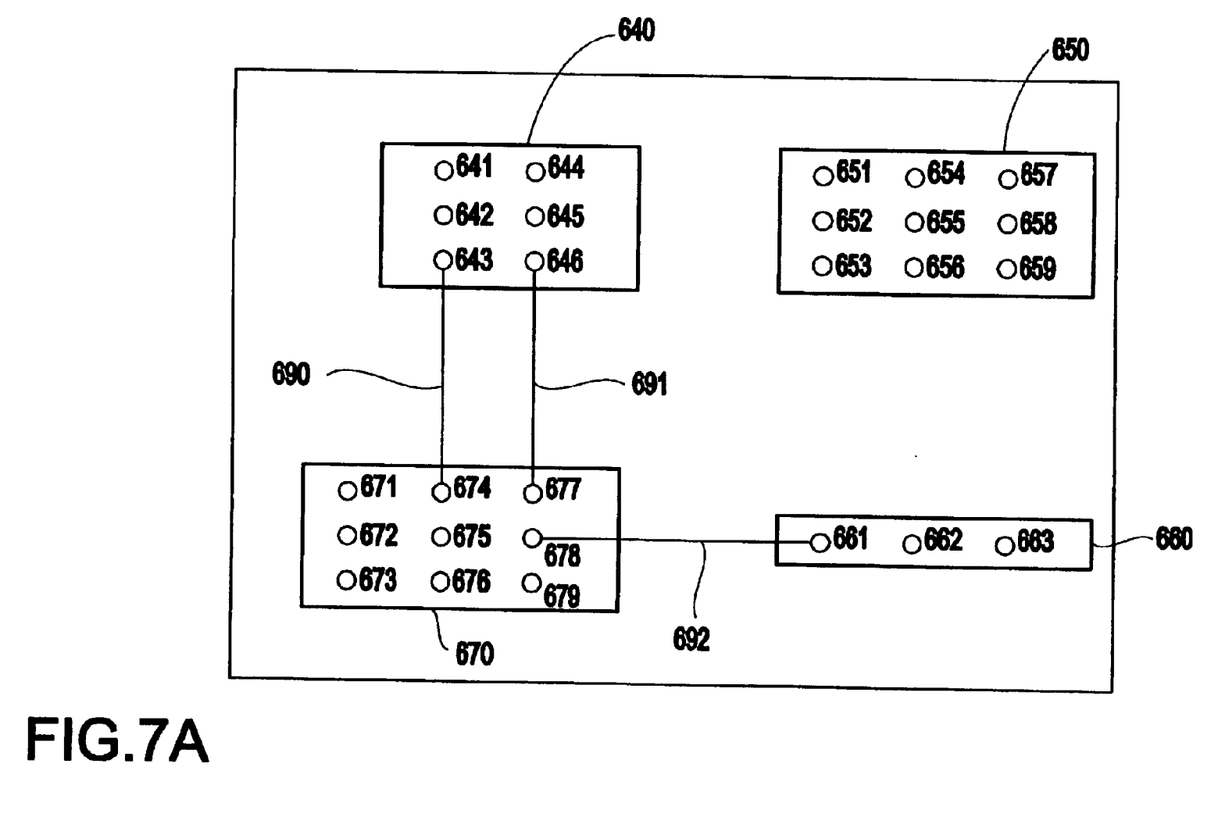
FIG. 7A illustrates a partial design layout comprising via error pairs.

FIG. 7A illustrates a partial design layout comprising via error pairs. A first via error pair 690, second via error pair 691, and third via error pair 692 are identified. First via error pair 690 comprises via 643 and via 674, second via error pair 691 comprises via 646 and via 677 and third via error pair 692 comprises via 661 and via 678. Using vector analysis and the design rule checker, via error pairs are identified. In other words, pairs are vias which are at risk of shorting with each other. In an alternative embodiment, vias can be identified which are at risk of shorting with non-via electrical components, such as, but not limited to, wires, etc.

Figure 7B:
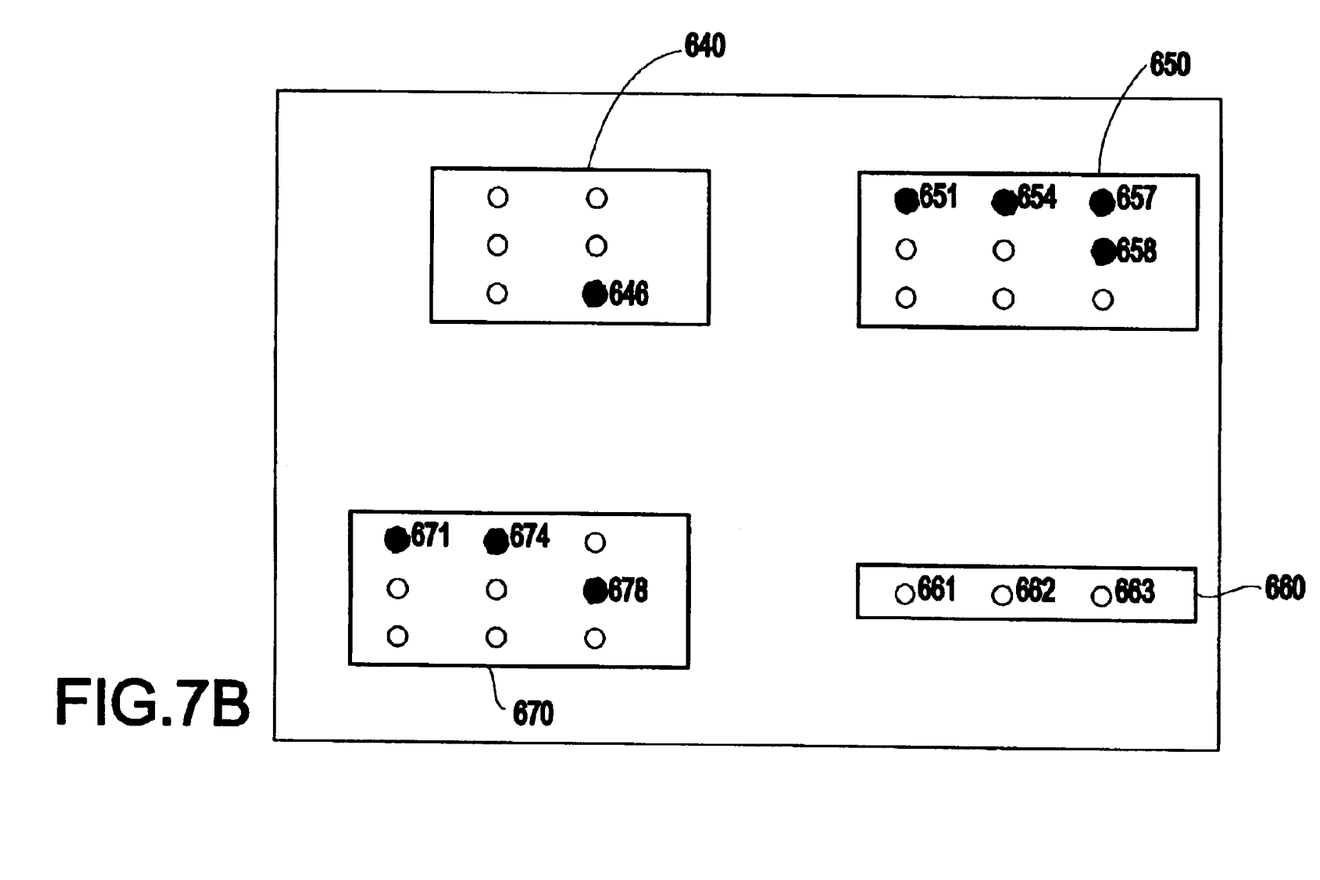
FIG. 7B illustrates a partial design layout comprising removed vias.

FIG. 7B illustrates a partial design layout comprising removed vias. Via 654, via 674 and via 678 are removed from their respective cells. However, the removal of these three vias also has the effect of removing vias 651, 654, 657 and 658 of second cell 650 and via 671 of fourth cell 670. Additional vias are removed since every instance of the cell (with the removed via) must reflect the removed via.

The determination of which via, within a via error pair, to remove is determined by calculating the effect the removal has on the overall design. Which ever via has the least effect on the overall design is chosen for removal. In a preferred embodiment of the present invention, this calculation considers how many shapes will be effected by the removed via, or how many new shapes will have to be created as a result of the removed via. In an alternative embodiment of the present invention, the calculation to determine which via to remove from a via error pair can include factors such as design failure rates, costs, end product usage, etc.

Figure 8:
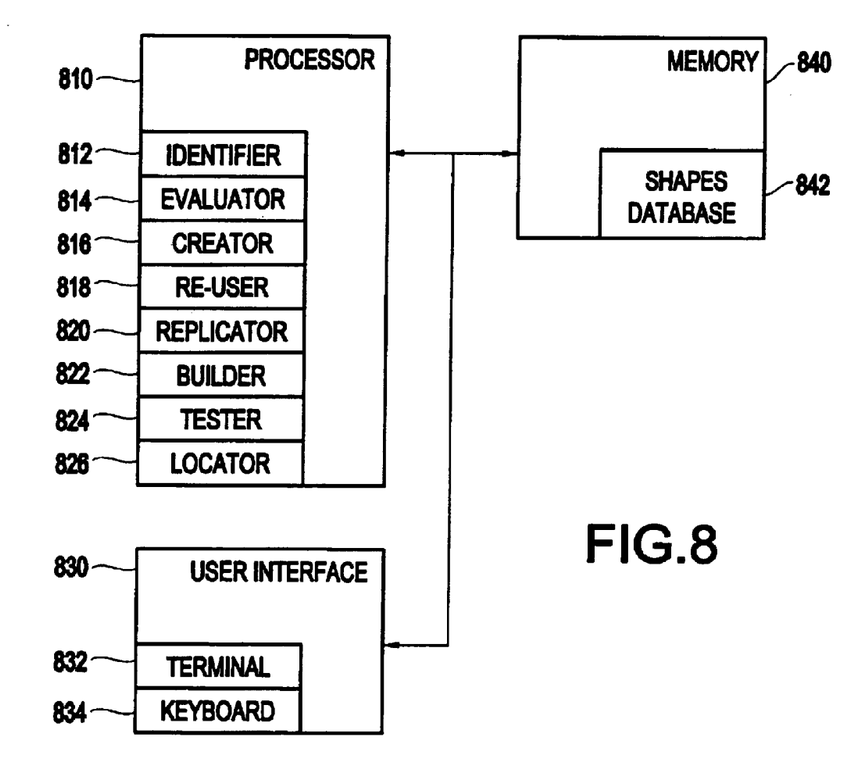
FIG. 8 illustrates a system level diagram of the preferred embodiment of the present invention.

FIG. 8 illustrates a system capable of implementing the present invention. System 800 comprises processor 810, memory 840 and user interface 830. Processor 810, memory 840 and user interface 830 are electrically connected, which includes but is not limited to wireless connection and/or Internet connection. Processor 810 comprises an identifier 812 for identifying a via which may potentially short, an evaluator 814 for evaluating each layout instantiation of said potentially shorting vias corresponding original cell residing in said shapes database for an electrically redundant path, a creator 816 for creating a cloned cell of said original cell, wherein said cloned cell is devoid of said potentially shorting via, a re-user 818 for reusing said cloned cell in said layout design for at least one said instantiation of said original cell, a replicator 820 for replacing the original cell with the cloned cell in the integrated circuit design, a builder 822 for building a layout design utilizing the cloned cell, a tester 824 for testing the layout design and a locator 826 for locating a cluster of vias in the integrated circuit design and having the identifier associate faulty vias and redundant vias in the cluster. Memory 840 comprises shapes database 842. Shapes database 842 comprises shapes or cells representing a layout design of an integrated circuit schematic. User Interface 830 comprises a terminal 832 for monitoring and or controlling processor 810 and keyboard 834 for monitoring and or controlling Processor 810.

Accordingly, the present invention provides a modification procedure that reduces errors on an integrated circuit due to via shorts while at the same time avoiding the un-nesting of the layout design and thereby permitting verification of the layout design by standard LVS verification tools.

The present invention identifies potentially shorting vias, the cells in the shapes database containing these vias, and corresponding electrically redundant paths. The current invention then creates cloned cells of the original cell, but without the potentially shorting vias and, in addition, the cloned cell is electrically equivalent to the original cell.

In addition, the present invention substitutes each instantiation of the original cell in the shapes database with the cloned cell when electrical equivalency is present, thereby removing such potentially shorting vias. This substitution combined with the cell cloning enables the use of standard LVS methods for verification.

In another embodiment of the present invention, the number of vias removed are minimized while, at the same time, all via electrical shorts are removed.

While the invention has been described in terms of preferred embodiments, those skilled in the art will recognize that the invention can be practiced with modification within the spirit and scope of the appended claims.

What is claimed is:

1. A method for reducing shorts in an integrated circuit design having cells, said method comprising:

identifying faulty vias as ones having a chance of shorting that is above a predetermined threshold;

evaluating an original cell containing a faulty via to determine if a redundant via exists for said faulty via; and removing said faulty via from said original cell to create a cloned cell.

2. The method of claim 1, wherein said method further comprises replacing said original cell with said cloned cell in said integrated circuit design.

3. The method of claim 1, wherein said identifying comprises selecting vias that violate predetermined spacing tolerances.

4. The method of claim 1, wherein said method further comprises:
   locating a cluster of vias in said integrated circuit design; and
   associating faulty vias and redundant vias in said cluster.

5. The method of claim 1, wherein said identifying comprises locating pairs of potentially shorting vias, wherein potentially shorting vias comprise a pair when a probability that a short will occur between said potentially shorting vias exceeds a predetermined threshold.

6. The method of claim 1, wherein said method further comprises building a layout design utilizing said cloned cell.

7. The method of claim 1, wherein said method further comprises:
   identifying a first potentially shorting via and a second potentially shorting via; and
   evaluating whether it is more efficient to remove said first potentially shorting via or said second potentially shorting via.

8. A system for reducing shorts in an integrated circuit design having cells, said system comprising:
   an identifier for identifying faulty vias as ones having a chance of shorting that is above a predetermined threshold;
   an evaluator for evaluating an original cell containing a faulty via to determine if a redundant via exists for said faulty via; and
   a remover for removing said faulty via from said original cell to create a cloned cell.

9. The system of claim 8, wherein said system further comprises a replicator for replacing said original cell with said cloned cell in said integrated circuit design.

10. The system of claim 8, wherein said system further comprises a locator for locating a cluster of vias in said integrated circuit design; and
    wherein said identifier associates faulty vias and redundant vias in said cluster.

11. The system of claim 8, wherein said system further comprises a user interface for applying said cloned cell to said integrated circuit design.

12. The system of claim 8, wherein said system further comprises a builder for building a layout design utilizing said cloned cell.

13. The system of claim 8, wherein said system further comprises a tester for testing said layout design.

14. The system of claim 8, wherein said system further comprises:
   an identifier for identifying a first potentially shorting via and a second potentially shorting via; and
   an evaluator for evaluating whether it is more efficient to remove said first potentially shorting via or said second potentially shorting via.

15. A method for reducing shorts in an integrated circuit design having cells, said method comprising:
   identifying faulty vias as ones having a chance of shorting that is above a predetermined threshold;
   evaluating an original cell containing a faulty via to determine if a redundant via exists for said faulty via;
   using said redundant via in place of said faulty via to create a cloned cell; and
   replacing said original cell with said cloned cell in said integrated circuit design.

16. The method of claim 15, wherein said identifying comprises selecting vias that violate predetermined spacing tolerances.

17. The method of claim 15, wherein said method further comprises:
   locating a cluster of vias in said integrated circuit design; and
   identifying faulty vias and associated redundant vias in said cluster.

18. The method of claim 15, wherein said identifying comprises locating pairs of potentially shorting vias, wherein potentially shorting vias comprise a pair when a probability that a short will occur between said potentially shorting vias exceed a predetermined threshold.

19. The method of claim 15, wherein said method further comprises building a layout design utilizing said cloned cell.

20. The method of claim 15, wherein said method further comprises:
   identifying a first potentially shorting via and a second potentially shorting via; and
   evaluating whether it is more efficient to remove said first potentially shorting via or said second potentially shorting via.

21. A program storage device readable by machine, tangibly embodying a program of instructions executable by said machine to perform a method for reducing shorts in an integrated circuit design having cells, said method comprising:
   identifying faulty vias as ones having a chance of shorting that is above a predetermined threshold;
   evaluating an original cell containing a faulty via to determine if a redundant via exists for said faulty via; and
   removing said faulty via from said original cell to create a cloned cell.

22. The program storage device of claim 21, wherein said method further comprises replacing said original cell with said cloned cell in said integrated circuit design.

23. The program storage device of claim 21, wherein said identifying comprises selecting vias that violate predetermined spacing tolerances.

24. The program storage device of claim 21, wherein said method further comprises:
   locating a cluster of vias in said integrated circuit design; and
   associating faulty vias and redundant vias in said cluster.

25. The program storage device of claim 21, wherein said identifying comprises locating pairs of potentially shorting vias, wherein potentially shorting vias comprise a pair when a probability that a short will occur between said potentially shorting vias exceeds a predetermined threshold.

26. The program storage device of claim 21, wherein said method further comprises building a layout design utilizing said cloned cell.

27. The program storage device of claim 21, wherein said method further comprises:
   identifying a first potentially shorting via and a second potentially shorting via; and
   evaluating whether it is more efficient to remove said first potentially shorting via or said second potentially shorting via.

* * * * *